March 29, 1960

N. E. EDWARDS 2,930,991

FREQUENCY SHIFT OSCILLATOR

Filed March 3, 1958

INVENTOR.
NORMAN E. EDWARDS
BY Edward J. Norton
ATTORNEY

United States Patent Office 2,930,991

Patented Mar. 29, 1960

2,930,991

FREQUENCY SHIFT OSCILLATOR

Norman E. Edwards, Haddonfield, N.J., assignor to Radio Corporation of America, a corporation of Delaware Application March 3, 1958, Serial No. 718,576

9 Claims. (Cl. 331—117)

Figure 1:
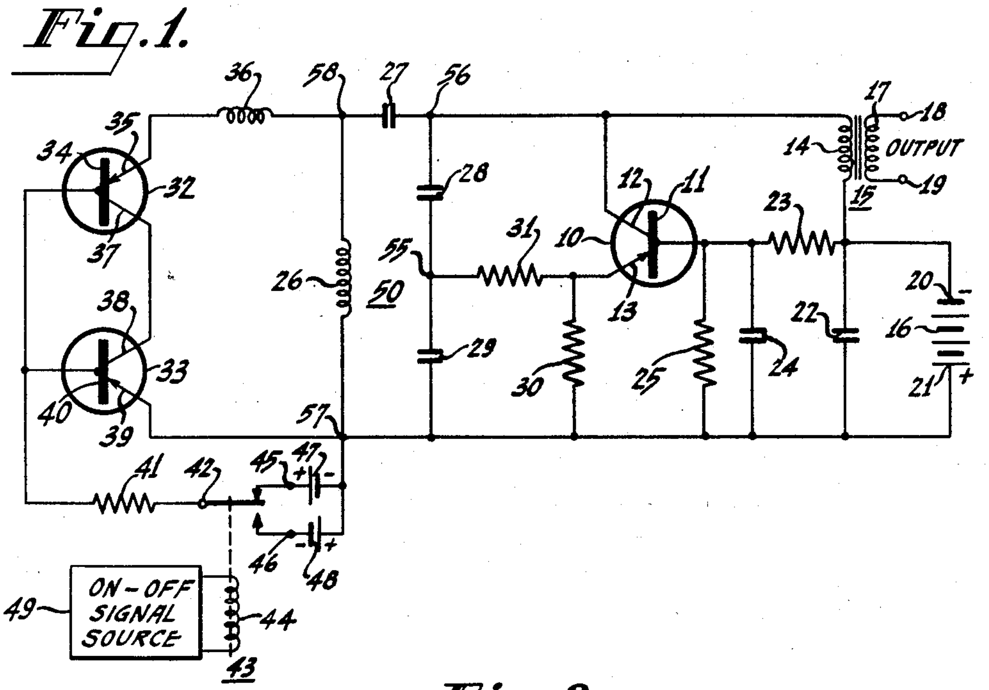

The invention relates to frequency shift oscillators. Particularly, the invention relates in one embodiment to a stable, inductance-capacitance controlled transistor frequency shift oscillator in which the shift in frequency may be appreciable in relation to the carrier frequency without a substantial change in the output level of the oscillator.

A general object of the invention is to provide an improved frequency shift oscillator capable of operating over a wide band of frequencies and in which the shift in frequency may be large in relation to the carrier frequency as compared to known arrangements without appreciably changing the output level of the oscillator.

Another object is to provide a novel inductance-capacitance controlled frequency shift oscillator in which transistors are used to perform the oscillator and frequency shift switching functions.

A further object is to provide an improved transistor frequency shift oscillator having stable frequencies despite transistor aging and voltage variations.

Known frequency shift oscillators have commonly used capacitive shifting elements. It is not possible in the operation of such oscillators to effect a satisfactorily large shift in frequency in relation to the carrier frequency, since the capacitive shifting elements operate, particularly at low frequencies, to change the dynamic impedance of the oscillatory circuit and, therefore, the oscillator output.

According to the present invention, an inductance-capacitance controlled transistor oscillator is provided which may be arranged in the manner of a Colpits type of oscillator. An electrical circuit including a pair of switching transistors connected in series with a second inductor is connected across the first or tuning inductor in the frequency-determining circuit of the oscillator. Means are provided to normally hold the switching transistors non-conducting, and the oscillator operates at its normal or first operating frequency as determined by the frequency-determining inductance-capacitance circuit. When the oscillator is to operate at its second or shifted operating frequency, additional means are provided to apply the proper bias voltages to the switching transistors to cause both of the switching transistors to conduct. This action causes the second inductor to be electrically connected in parallel with the first inductor in the frequency-determining circuit of the oscillator. The value of the second inductor is chosen so that when it is connected in parallel with the first inductor, the oscillator operates at the shifted or second operating frequency. Alternatively, the switching transistors can be made to conduct normally, and to be caused to become non-conducting when it is desired to operate the oscillator at a different frequency.

A frequency shift oscillator is provided capable of being shifted over a wider range of frequencies relative to the carrier frequency than has hitherto been possible in the operation of frequency shift oscillators using capacitive shifting elements. A frequency shift oscillator is disclosed which is particularly suitable for use as the transmitting element in high speed tone signalling systems.

Figure 2:
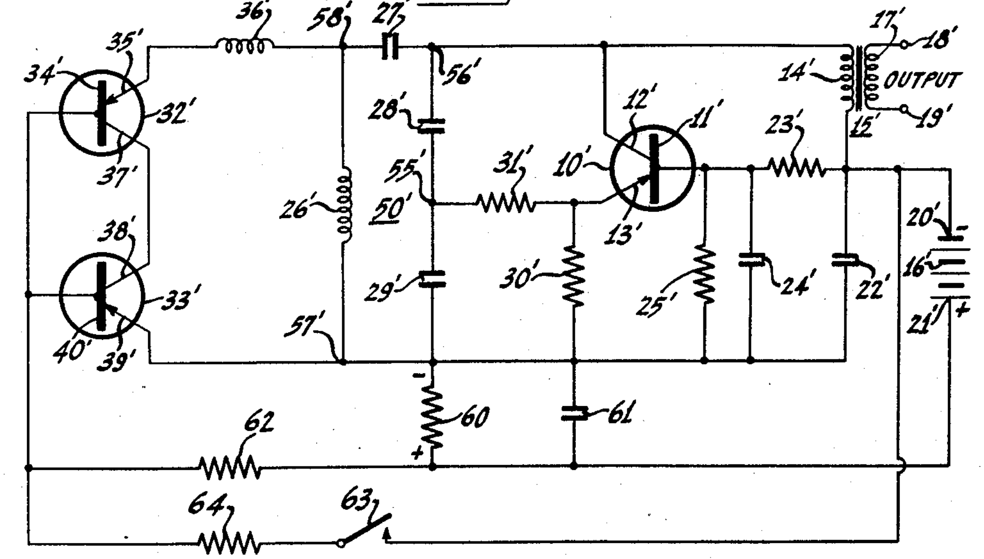

A more detailed description of the invention will now be given in connection with the accompanying drawing in which:

Figure 1 is a circuit diagram of one embodiment of a transistor frequency shift oscillator constructed according to the invention; and Figure 2 is a circuit diagram of a further embodiment of the invention.

In Figure 1, there is shown an inductance-capacitance controlled transistor oscillator having a transistor device 10 provided with a base electrode 11, collector electrode 12 and emitter electrode 13. The transistor 10 is shown and will be described as a PNP junction transistor of N type conductivity. However, as will be described, the invention is not limited to the use of this particular type of transistor device. The collector electrode 12 is connected through the primary winding 14 of an output transformer 15 to the negative terminal or side 20 of a source of unidirectional potential represented as a battery 16. The secondary winding 17 of the transformer 15 is connected to a pair of output terminals 18, 19 to which a desired utilization circuit responsive to the oscillator output may be connected. An electrical path is completed from the negative terminal 20 to the positive terminal or side 21 of the battery 16 including a decoupling or by-pass capacitor 22 conected to the terminal 21, a resistor 23, a decoupling or by-pass capacitor 24 connected to the terminal 21, the base electrode 11 and a resistor 25.

The frequency-determining or resonant circuit 50 of the oscillator includes the tuning inductor 26, a blocking capacitor 27 and a pair of capacitors 28, 29 which are connected in series across the inductor 26 and form a capacitor voltage dividing network. The emitter electrode 13 is connected to a point 55 on the connection between capacitors 28, 29 over an electrical path including a resistor 30 connected to the terminal 21 and a resistor 31. The collector electrode 12 is connected to the junction 56 of the capacitor 27 and capacitor 28, while the junction 57 of the inductor 26 and capacitor 29 is connected over the oscillator return lead to the positive terminal 21. The inductor 26 may be made variable to provide for the tuning of the oscillator.

According to the present invention, a pair of switching transistors 32 and 33 shown by way of example as PNP transistors of N type conductivity are provided. The transistor 32 includes a base electrode 34, an emitter electrode 35 connected through an inductor or reactive element 36 to the junction 58 of the inductor 26 and capacitor 27, and a collector electrode 37 connected to the collector electrode 38 of the second switching transistor 33. The emitter electrode 39 of transistor 33 is connected to the junction 57 of the inductor 26 and the capacitor 29 and, therefore, to the positive terminal 21. The inductor 36 is connected across or in parallel with the inductor 26 through the switching transistors 32 and 33. The base electrode 34 of transistor 32 and the base electrode 40 of the transistor 33 are connected in common through a resistor 41 to the armature 42 of a relay 43. The relay 43 includes a winding 44 and a pair of contacts 45 and 46 positioned so that the armature 42 is moved therebetween according to the energized condition of the winding 44. The contact 45 is connected to the junction 57 of capacitor 29 and inductor 26 through a source of unidirectional potential represented as a battery 47 poled to supply a positive potential to the contact 45. The contact 46 is also connected to the junction 57 of inductor 26 and capacitor 29 through a second source of unidirectional potential represented as a battery 48 poled to supply a negative potential to the contact 46. A source of signal energy shown as an on-off signal source 49 is connected to the winding 44. The signal source 49 may be a telegraphic sending or keying apparatus or any apparatus capable of being selectively operated to supply an energizing signal to the winding 44 of the relay 43.

On start-up, a negative direct current potential is applied from terminal 20 to the collector electrode 12 through the winding 14. The circuit arrangement including resistors 23, 25 and capacitors 22, 24 functions as a voltage divider from which a proper bias voltage is applied to base electrode 11 to cause the collector electrode 12 to be biased negative with respect to the base electrode 11. A positive bias voltage is applied from terminal 21 through resistor 30 to the emitter electrode 13 such that the emitter electrode 13 is biased positive with respect to the base electrode 11. That is, both the base electrode 11 and the collector electrode 12 are negative with respect to the emitter electrode 13. The collector electrode 12 is said to be biased in the reverse and/or non-conducting direction with respect to the base electrode 11. The emitter electrode 13 is said to be biased in the forward and/or current conducting direction with respect to the base electrode 11. In this condition, the transistor 10 conducts.

Upon the transistor 10 becoming conducting, the collector electrode 12 voltage goes more positive and continues to become increasingly more positive going until the normal operating or working point of the transistor 10 is established. This normal working point is determined according to the value of the battery 16 and of the bias voltages supplied to the base and emitter electrodes 11 and 13, respectively, in the manner described. A positive going current pulse is applied from the collector electrode 12 to the junction 56 of the capacitors 27 and 28. Capacitors 28, 29 charge in the proper direction to cause the frequency-determining or resonant circuit 50 to oscillate at a selected frequency determined according to the values of inductor 26 and capacitors 28, 29. A negative going voltage is applied from the junction 55 of capacitors 28, 29 through the limiting resistor 31 to the emitter electrode 13, biasing the emitter electrode 13 more negative. Transistor 10 conducts more heavily, and an increasingly more positive going voltage appears at the collector electrode 12. This action continues until the point of transistor saturation is reached.

Since the rate of current change at the collector electrode 12 now becomes zero, the voltage applied to the frequency-determining circuit 50 also becomes zero. The resonant circuit 50 is free to oscillate at its natural rate. As the voltage applied from the junction 55 of the capacitors 28, 29 to the emitter electrode 13 via the limiting resistor 31 starts to reverse in polarity, the emitter electrode 13 voltage becomes more positive toward the normal working point of the transistor 10. As the voltage at the emitter electrode 13 becomes increasingly more positive going, the transistor 10 conducts less heavily. The collector electrode 12 voltage becomes increasingly more negative going, and a negative going current pulse is applied from the collector electrode 12 to the junction 56 of capacitors 27, 28. The pulse so applied is in the proper phase to charge the capacitors 28, 29 in the proper direction to sustain the oscillations of the resonant circuit 50. As the resonant circuit 50 continues to oscillate at the resonant frequency thereof, the voltage applied to the emitter electrode 13 continues to become more positive going. The collector electrode 12 voltage becomes increasingly more negative going as the transistor 10 is driven toward cut off. This action continues until the transistor 10 is driven to cut off. The rate of current change at the collector electrode 12 becomes zero, and a zero voltage is applied to the junction 56 of capacitors 27, 28. The resonant circuit 50 is free to oscillate at its natural rate. The biasing voltage applied to the emitter electrode 13 from the junction of capacitors 28, 29 reverses in polarity and becomes more negative going. Transistor 10 conducts, and the voltage appearing at the collector electrode 12 becomes increasingly more positive going, and so on. The oscillator continues to operate in the manner described.

From the above description, it is apparent that the transistor 10 and the frequency-determining circuit 50 are included in a Colpits type of oscillator. The values of the inductor 26 and capacitors 28, 29 are chosen so that the inductance to capacitance ratio of the tuned circuit is small with the Q (dynamic resistance) of the inductor 26 being relatively low. By this construction, the oscillating frequency is independent of variations in transistor input capacitance. Degeneration introduced by the resistor 30 stabilizes the oscillator against changes in gain caused by variations in the supply voltage or transistor gain.

As the transistor 10 is made to operate in the manner described, an alternating current signal having a frequency determined by the values of the components in the resonant circuit 50 appears across the primary winding 14. The alternating current signal induced in the secondary winding 17 is applied from the secondary winding 17 to a desired utilization circuit via the terminals 18, 19.

The on-off signal source 49 normally supplies a zero or no signal to the winding 44 of relay 43, and the winding 44 remains unenergized. Armature 42 engages contact 45. The battery 47 is placed between the emitter electrode 39 and base electrode 40 of the transistor 33 through the resistor 41, and between the emitter electrode 35 and base electrode 34 of the transistor 32 through inductors 26, 36 and resistor 41. The base electrodes 34, 40 are biased positive, while the emitter electrodes 35, 39 are biased negative. The value of the battery 47 and of the base current limiting resistor 41 are determined so that the base electrodes 34 and 40 are biased sufficiently positive with respect to the emitter electrodes 35 and 39, respectively, to cause the transistors 32, 33 to remain cut-off or non-conducting. Since it is only necessary to hold the transistors 32, 33 biased below cut-off, the battery 47 and the bias voltages supplied thereby need not be large. The transistors 32, 33 act as high impedances so that the inductor 36 is not connected across the tuning inductor 26 of the resonant circuit 50. The oscillator including the transistor 10 and the resonant circuit 50 is free to operate at its natural ferquency.

It is preferable that two switching transistors 32, 33 connected in series opposition be used rather than a single transistor. A single transistor would tend to operate as a rectifier during one half cycle of the alternating current signal appearing at the junction 58 of the inductors 26 and 36, depending upon the manner in which the single transistor was connected in series between the inductors 36 and 26. The conduction of the single transistor would cause the inductor 36 to be placed across the inductor 26 during each half cycle, thereby distorting the operation of the oscillator. By using the two transistors 32, 33 connected in series opposition, any conduction of one of the transistors in the manner of a rectifier automatically causes the other transistor to be biased below cut-off. For example, if the transistor 32 should conduct during the negative half cycle of the alternating current signal appearing at the junction 58, the positive going voltage appearing at the collector electrode 37 is applied to the collector electrode 38 of the transistor 33. The collector electrode 38 is biased positive with respect to the emitter electrode 39, and the transistor 33 is held non-conducting, and so on.

When it is desired to shift the frequency of the oscillator, the on-off signal source 49 is operated to supply an energizing signal to the winding 44. Upon the winding 44 being energized, armature 45 disengages contact 45 and engages contact 46. Battery 48 is now placed between the emitter electrode 35 and the base electrode 34 of transistor 32 through inductors 26, 36 and resistor 41. The battery 48 is also placed between the emitter electrode 39 and base electrode 40 of the transistor 33 through the resistor 41. The base electrodes 34, 40 are now biased negative, while the emitter electrodes 35, 39 are biased positive. The collector electrodes and the base electrodes of the transistors 32, 33 become negative with respect to the emitter electrodes, and transistors 32, 33 conduct. The values of the base current limiting resistor 41 and of the battery 48 are chosen so that there results a current, for example, of one milliampere, at the base electrodes 34, 40 to cause each of the transistors 32, 33 to be fully conductive. For example, it has been found in the operation of a unit constructed according to the teaching of this invention that a 22 volt battery 48 may be used with a 10,000 ohm limiting resistor 41 to cause the necessary base current to occur at the respective PNP transistors 32, 33. The transistors 32, 33 become, in effect, short circuits. An electrical path is completed through the conducting transistors 32 and 33, and the inductor 36 is electrically connected in parallel with the inductor 26 of the resonant circuit 50.

In applications where a relatively high degree of stability is desired, the Q (dynamic resistance) of the inductor 36 is chosen to be high with respect to that of the inductor 26. Preferably the Q of the inductor 36 is chosen to be more than five times that of the inductor 26 so that the parallel connection of the inductors 26, 36 results in a reduction of the inductance in the resonant circuit 50 but causes the effective Q of the two inductors 36, 26 in parallel to be substantially still that of the inductor 26 alone. Since the Q of the resonant circuit 50 is not changed, the oscillator remains stable in operation. The oscillator operates at the higher or shifted frequency, depending upon the value of the inductor 36.

In applications where a lesser stability of output level can be tolerated, the Q of the inductor 36 can be determined according to the particular results desired and the equipment available. The invention is not to be understood as limited to applications requiring the high stability of output level referred to above and, therefore, a critical relationship between the Q of the inductor 36 and that of inductor 26. The invention is readily adaptable for use in a wide range of applications where a simple, reliable frequency shift oscillator is employed. In practice, the Q of the inductors 36, 26 may be determined so as to obtain the stability of output level desired.

By the selective operation of the relay 43, therefore, the switching transistors 32, 33 can be made to be conducting or non-conducting. When non-conducting, the switching transistors 32, 33 represent high impedances effectively disconnecting the inductor 36 from across the inductor 26. The oscillator operates at its natural frequency as determined by the values of the components in the resonant circuit 50. When the transistors 32, 33 are made to conduct, current flows over the electrical path including transistors 32, 33 and inductors 36, 26. The inductor 36 is effectively placed in parallel with the inductor 26, decreasing the inductance of the resonant circuit 50 according to the value of the inductor 36 and causing the oscillator to operate at the desired higher shifted frequency.

A further embodiment of the frequency shift oscillator of the invention is shown in Figure 2. The arrangement given in Figure 2 is similar to that given in Figure 1 except that the additional battery sources 47, 48 used to control the operation of the switching transistors 32, 33 are eliminated. For ease of description, the components in Figure 2 which correspond to components shown in Figure 1 have been given the same reference numerals primed.

In the arrangement of Figure 1, the oscillator is returned directly to the positive terminal 21 of the battery 16. In the arrangement of Figure 2, the oscillator is returned to the positive terminal 21′ of the battery 16′ through a resistor 60 and decoupling capacitor 61. Upon the conduction of the transistor 10′, a voltage is developed across the resistor 60 in the polarity indicated. A positive voltage is applied from the lower end of the resistor 60 to the base electrodes 34′, 40′ of the switching transistors 32′ and 33′, respectively, over an electrical path including a relatively large limiting resistor 62. At the same time, a negative voltage is applied from the upper end of the resistor 60 to the emitter electrode 39′ of the transistor 33′ and through the inductors 26′, 36′ to the emitter electrode 35′ of the transistor 32′. The base electrodes of the transistors 32′, 33′ are biased positive with respect to the emitter electrodes, and the transistors 32′, 33′ are held cut-off or non-conducting. The electrical path including the inductor 36′ across the inductor 26′ remains incomplete. The frequency shift oscillator operates at its natural frequency as determined by the resonant circuit 50′.

When the frequency of the oscillator is to be changed to its shifted or higher frequency, a normally open switch 63 is closed. In practice, the switch 63 may be an electronic gating switch in the form of a transistor or similar device, a manually operated key or the contacts on an automatic sender. The switch 63 may be any arrangement capable of selectively opening and closing a circuit completed therethrough. When the switch 63 is closed, an electrical path is completed from the negative terminal 20′ to the base electrodes 34′, 40′ through the switch 63 and a current limiting resistor 64. The base electrodes are now biased negative with respect to the emitter electrodes of the transistors 32′ and 33′, and the transistors 32′, 33′ conduct. As in the case of Figure 1, the value of the resistor 64 is chosen so that a current occurs at the base electrodes 34′, 40′ sufficient to cause the transistors 32′, 33′ to be fully conductive. Transistors 32′ and 33′ become, in effect, short circuits, and current flows over the electrical path including inductors 26′, 36′ and the transistors 32′, 33′. The inductor 36′ is placed in parallel with the inductor 26′, and the oscillator operates at the higher shifted frequency as determined by the value of the inductor 36′ due to the resulting decreased inductance in the resonant circuit 50′. The operation of the arrangement of Figure 2 is essentially the same as that of the arrangement in Figure 1. However, the arrangement of Figure 2 does have the advantage of greater simplicity in construction and operation in that the bias voltages for operating the switching transistors 32′, 33′ are derived from the single battery source 16 and by the operation of the oscillator rather than by the use of the two additional batteries 47, 48 shown in Figure 1.

In order to provide a more complete understanding of the invention, a detailed reference will now be made to the arrangement of a unit constructed according to the embodiment of the invention given in Figure 2. The transistors 10′ 32′ and 33′ can be PNP transistors of the type known in the art as 2N270. A 15 volt battery 16′ may be used. The values of the various components given only by way of example may be as follows:

| | |
|---|---|
| Resistor 23′ | 10,000 ohms. |
| Resistor 25′ | 560 ohms. |
| Resistor 30′ | 2,700 ohms. |
| Resistor 31′ | 330 ohms. |
| Resistor 60 | 680 ohms. |
| Resistor 62 | 180,000 ohms. |
| Resistor 64 | 7,500 ohms. |
| Capacitor 22′ | 1.0 microfarad. |
| Capacitor 24′ | 0.5 microfarad. |
| Capacitor 27′ | 1.0 microfarad. |
| Capacitor 28′ | 0.1 microfarad. |
| Capacitor 29′ | 1.0 microfarad. |
| Capacitor 61 | 1.0 microfarad. |
| Inductor 26′ | 160 microhenries, $Q \approx 10$. |
| Inductor 36′ | 250 microhenries, $Q \approx 50$. |

The values of the inductors 26', 36' are nominal and are given for reference only.

With the above values assigned to the various components therein, the oscillator can be made to have a carrier or center operating frequency of 1600 cycles per second which is effectively shifted plus or minus 250 cycles per second. During the periods in which transistors 32', 33' remain non-conducting, the oscillator will operate at its lower or natural frequency of 1350 cycles per second. Upon transistors 32', 33' becoming conducting such that the inductor 36' is placed in parallel with inductor 26' reducing the inductance of the resonant circuit 50', the oscillator will operate at a shifted frequency of 1850 cycles per second. A large shift in the oscillator frequency in relation to the carrier or center frequency is thus obtained. In a unit constructed according to the arrangement given in Figure 2 and including components having values similar to the values given above, it was found that the frequency shift oscillator could be operated between the frequency limits given above by way of example without the occurrence of any appreciable change in the output level of the oscillator. In the unit constructed as described the change was 1.0 db. This result is obtainable since no capacitive shifting elements are used. Any effort to shift the oscillator frequency particularly at low frequencies by the same proportions using capacitive shifting elements would require a large capacitor of such a size that the use thereof would either stop the oscillator or cause an excessive change in the output level of the oscillator.

The frequency shift oscillator of the invention is not to be understood as limited to low frequency operation. While the oscillator of the invention is particularly valuable in applications where a large shift in oscillator frequency is desired at low frequencies, the oscillator may also be used equally successfully at higher frequencies up to and including frequencies in the megacycle range. The operating frequency of the oscillator is limited for the most part only by the switching characteristics of the transistor 10, 10' used in the oscillator.

While an inductance-capacitance controlled Colpits type of oscillator has been shown and described as part of the frequency shift oscillator of the invention, other known inductance-capacitance controlled oscillators might be used to meet the requirements of a particular application. While the transistors 10, 32 and 33 have been described as being PNP transistors, NPN transistors of P type conductivity may be used by merely altering the connections to the electrodes of the transistors 10, 32 and 33 in a known manner to provide suitable operating biasing. Other known transistor or similar current conducting devices may be used. The two switching transistors 32, 33 are preferably of the same type having similar operating characteristics to permit the proper control over the completion of the electrical path therethrough. While the transistor 10 may be of the same type as the transistors 32 and 33, a transistor 10 of a different type than that used for the transistors 32, 33 may be employed according to the requirements of a particular application.

A frequency shift oscillator using transistors to perform the oscillator and frequency switching functions is disclosed by the invention. By using transistors to perform the frequency switching function, a stable frequency shift oscillator is provided capable of operating over a wide range of frequencies and in which the shift in frequency may be large in relation to the carrier or center frequency of the oscillator without any appreciable change in the oscillator output level.

What is claimed is:

1. A frequency shift oscillator comprising, in combination, an oscillator circuit including an inductance-capacitance parallel tuned resonant circuit having included therein at least a first inductor, a second inductor having a Q higher than that of said first inductor, first and second transistor devices each having base, emitter and collector electrodes, means to connect said emitter electrode of said first device through said second inductor to one side of said first inductor, means to connect said collector electrode of said first device to said collector electrode of said second device, means to connect said emitter eletrode of said second device to the other side of said first inductor, and means connected to said base electrodes of said first and said second device and arranged to selectively apply the proper voltages to said base electrodes to cause said first and second devices to conduct so as to electrically connect said second inductor across said first inductor, the Q of said second inductor being determined to cause the Q of said resonant circuit to remain substantially unchanged upon said second inductor being connected across said first inductor.

2. A frequency shift oscillator comprising, in combination, an oscillator circuit including an inductance-capacitance parallel tuned resonant circuit having included therein at least a first inductor, a second inductor having a Q higher than that of said first inductor, first and second transistor devices each having base, emitter and collector electrodes, means to connect said emitter electrode of said first device through said second inductor to one side of said first inductor, means to connect said collector electrode of said first device to said collector electrode of said second device, means to connect said emitter electrode of said second device to the other side of said first inductor, a switching circuit having two operating conditions connected to said base electrodes of said first and said second device and arranged when in one condition to apply the proper voltages to said base electrodes to maintain said first and second devices non-conducting whereby said second inductor is electrically disconnected from across said first inductor, said switching circuit being arranged when in the other of said conditions to apply the proper voltages to said base electrodes to cause said first and second devices to conduct so as to electrically connect said second inductor through said first and second devices across said first inductor, the Q of said second inductor being determined to cause the effective Q of said first and second inductors in parallel to be substantially that of said first inductor alone.

3. A frequency shift oscillator comprising, in combination, an oscillator circuit including an inductance-capacitance parallel tuned resonant circuit having included therein at least a first inductor, a second inductor having a Q higher than that of said first inductor, first and second transistor devices each having base, emitter and collector electrodes, means to connect said emitter electrode of said first device through said second inductor to one side of said first inductor, means to connect said collector electrode of said first device to said collector electrode of said second device, means to connect said emitter electrode of said second device to the other side of said first inductor, a switching circuit connected between the base and emitter electrodes of said first and said second device and arranged to normally apply the proper voltages to said base and emitter electrodes to maintain said first and second devices non-conducting, whereby said second inductor is electrically disconnected from across said first inductor, and means connected to said switching circuit and arranged to operate said switching circuit to apply the proper voltages to said base and emitter electrodes to cause said first and second devices to conduct so as to electrically connect said second inductor in parallel with said first inductor through said first and second devices the Q of said second inductor being at least five times that of said first inductor, whereby the effective Q of said first and second inductors in parallel is substantially that of said first inductor alone.

4. A frequency shift oscillator as claimed in claim 3 and wherein said oscillator circuit including said resonant circuit is arranged to operate as an inductance-capacitance controlled Colpits type of oscillator.

5. A frequency shift oscillator comprising, in combination, an oscillator circuit including an inductance-capacitance parallel tuned resonant circuit having at least a first inductor included therein, a second inductor having a Q higher than that of said first induction, first and second transistor devices each having an emitter, base and collector electrode, means to connect said emitter electrode of said first device through said second inductor to one side of said first inductor, means to connect said collector electrode of said first device to said collector electrode of said second device, means to connect said emitter electrode of said second device to the other side of said first inductor, means to connect the base electrodes of said first and said second device to a point of potential in said oscillator circuit such that the proper voltages are applied from said point to said base electrodes to normally maintain said devices non-conducting, whereby said second inductor is normally electrically disconnected from across said first inductor, and additional means connected to said base electrodes and arranged to be selectively operated to apply the proper voltages to said base electrodes to cause said devices to conduct so as to electrically connect said second inductor through said first and second devices across said first inductor, the Q of said second inductor being determined to cause the Q of said resonant circuit to remain substantially unchanged upon said second inductor being connected across said first inductor.

6. A frequency shift oscillator comprising, in combination, an oscillator circuit including an inductance-capacitance parallel tuned resonant circuit having at least a first inductor included therein, a second inductor having a Q higher than that of said first inductor, first and second transistor devices each having an emitter, base and collector electrode, means to connect said emitter electrode of said first device through said second inductor to one side of said first inductor, means to connect said collector electrode of said first device to said collector electrode of said second device, means to connect said emitter electrode of said second device to the other side of said first inductor, a resistor, means to return said oscillator circuit to a point of reference potential through said resistor, means to connect the base electrodes of said first and second devices to the junction of said resistor and said point of reference potential and to cause the voltage developed across said resistor and applied from said resistor to said base electrodes to be of a proper value to maintain said devices normally non-conducting, whereby said second inductor is normally electrically disconnected from across said first inductor, and additional means connected to said base electrodes and arranged to be selectively operated to apply the proper voltages to said base electrodes to cause said devices to conduct so as to electrically connect said second inductor through said first and second devices across said first inductor, the Q of said second inductor being determined to cause the effective Q of said first and second inductors in parallel to be substantially that of said first inductor alone.

7. A frequency shift oscillator as claimed in claim 6 and wherein said oscillator circuit including said resonant circuit is arranged as an inductance-capacitance controlled Colpits type of oscillator.

8. A frequency shift oscillator as claimed in claim 6 and wherein said Q of said second inductor is more than five times that of said first inductor.

9. A frequency shift oscillator as claimed in claim 1, said oscillator circuit also including a third transistor device having base, emitter and collector electrodes, means to couple said last-mentioned collector and emitter electrodes to said resonant circuit to form a regenerative type of oscillator, means to bias the electrodes of said third device to cause said third device to conduct, and an output circuit connected to said last-mentioned collector electrode.

References Cited in the file of this patent

UNITED STATES PATENTS

| | | |
|---|---|---|
| 2,652,539 | Kearney et al. | Sept. 15, 1953 |
| 2,764,687 | Buchanan et al. | Sept. 25, 1956 |
| 2,836,724 | Kaminow | May 27, 1958 |

OTHER REFERENCES

"Handbook of Semiconductor Electronics," by Hunter, published by McGraw-Hill, first edition, Oct. 15, 1956, two pages 16–25 and 16–26.